United States Patent [19]

Paoli et al.

[11] Patent Number: 5,138,625
[45] Date of Patent: Aug. 11, 1992

[54] QUANTUM WIRE SEMICONDUCTOR LASER

[75] Inventors: Thomas L. Paoli, Los Altos, Calif.; John E. Epler, Zurich, Switzerland

[73] Assignee: Xerox Corporation, Stamford, Conn.

[21] Appl. No.: 638,589

[22] Filed: Jan. 8, 1991

[51] Int. Cl.$^5$ ................................. H01S 3/19
[52] U.S. Cl. ........................ 372/46; 372/45; 372/48; 372/50
[58] Field of Search ............... 372/47, 45, 46, 48, 372/50

[56] References Cited

U.S. PATENT DOCUMENTS

| | | | |
|---|---|---|---|
| 4,504,952 | 3/1985 | Hartman et al. | 372/46 |
| 4,675,710 | 6/1987 | Ishikawa et al. | 357/17 |
| 4,723,251 | 2/1988 | Sakakibara et al. | 372/48 |
| 4,797,374 | 1/1989 | Scott et al. | 437/129 |
| 4,839,307 | 6/1989 | Imanaka et al. | 372/46 |
| 4,860,298 | 8/1989 | Botez et al. | 372/48 |
| 4,874,690 | 10/1989 | Holonyak et al. | 437/173 |
| 4,933,299 | 6/1990 | Durose | 437/81 |
| 4,962,057 | 10/1990 | Epler et al. | 437/81 |
| 4,980,314 | 12/1990 | Strege | 437/129 |
| 5,013,684 | 5/1991 | Epler et al. | 437/129 |
| 5,073,893 | 12/1991 | Kondou | 372/45 |

FOREIGN PATENT DOCUMENTS

| | | | |
|---|---|---|---|
| 0076588 | 6/1981 | Japan | 372/48 |
| 0023292 | 2/1982 | Japan | 372/45 |
| 0220485 | 12/1983 | Japan | 372/48 |
| 0080881 | 4/1986 | Japan | 372/48 |

OTHER PUBLICATIONS

Sakaki Hiroyuki, "Scattering Suppression and High-Mobility Effect of Size-Quantized Electrons in Ultra-tine Semiconductor Wire Structures", *Japanese Journal of Applied Physics*, vol. 19, No. 12, Dec. 1980, pp. L735–L738.

Tsuchiya et al., "Optical Anistrophy in a Quantum-Well-Wire Array with Two-Dimensional Quantum Confinement", *Physical Review Letters*, vol. 62(4), pp. 466–469, Jan. 23, 1989.

A. C. Warren et al., "Masked, Anisotropic Thermal Etching and Regrowth for In Situ Patterning of Compound Semiconductors", *Applied Physics Letters*, vol. 51(22), pp. 1818–1820, Nov. 30, 1987.

Fukui et al., "(AlAs)$_{0.5}$(GaAs)$_{0.5}$ fractional-layer superlattices grown on (001) vicinal surfaces by metalorganic chemical vapor deposition". *Applied Physics Letters* 50, p. 824 (1987).

H. Tanaka et al., "Single-Longitudinal-Mode Self Aligned AlGa(As) Double-Heterostructure Lasers Fabricated by Molecular Beam Epitaxy", *Japanese Journal of Applied Physics*, vol. 24, pp. L89–L90, 1985.

T. Hiramoto et al., "One-dimensional GaAs wires fabricated by focused ion beam implantation", *Applied Physics Letters*, vol. 51, No. 20, pp. 1620–1622, Nov. 16, 1987.

J. Cibert et al., "Optically detected carrier confinement to one or zero dimension in GaAs quantum well wires and boxes", *Applied Physics Letters*, vol. 49, No. 19, pp. 1275–1277, Nov. 10, 1986.

Primary Examiner—James W. Davie
Attorney, Agent, or Firm—William Propp

[57] ABSTRACT

A quantum wire in a groove in a semiconductor layer emits coherent light in a semiconductor laser structure. Linear array, vertical array and two-dimensional array multiple quantum wire semiconductor laser structures are also embodiments of the quantum wire in a semiconductor layer groove. Optical waveguides and reverse bias junctions can also be formed with the quantum wire semiconductor laser structures.

38 Claims, 8 Drawing Sheets

QUANTUM WIRE SEMICONDUCTOR LASER

GOVERNMENT RIGHTS

The Government has certain rights in this invention pursuant to Contract No. 86F173100 awarded by the Defense Advanced Research Projects Agency (DARPA).

CROSS-REFERENCE TO RELATED APPLICATIONS

This application contains subject matter that is related to the subject matter of U.S. Pat. No. 4,962,057, patent application Ser. No. 07/579,218, a file wrapper continuation of patent application Ser. No. 07/328,988, filed Mar. 24, 1989, now abandoned, patent application Ser. No. 07/581,398, a file wrapper continuation of patent application Ser. No. 07/328,275, filed Mar. 24, 1989, now abandoned, U.S. Pat. No. 5,013,684, patent application Ser. No. 07/542,857, filed Jun. 25, 1990, and copending patent application Ser. No. 07/638,587, now allowed, filed on the same date as the present application, all assigned to the same assignee herein and incorporated by reference herein.

BACKGROUND OF THE INVENTION

The present invention relates generally to semiconductor structures and more particularly to semiconductor laser structures having quantum wires fabricated employing in situ photo induced modifications to compound semiconductor films during epitaxial growth.

The employment of quantum wires to confine the active regions of semiconductor lasers to two dimensions in quantum well regions is known in the art. Quantum wires in semiconductors are regions in which the charge carriers are quantum confined in the 2 dimensions orthogonal to the axis of the wire. Quantum effects in GaAs layers are most strong when the thickness is less than 50 nm. A quantum wire will still be useful if only one of its dimensions is less than 50 nm. For GaAs this typically means a region for the quantum wire in a semiconductor smaller than about 50 nm by 100 nm.

In situ fabrication of arrays of quantum wires has been contemplated and demonstrated by Fukui et al., "(AlAs)$_{0.5}$(GaAs)$_{0.5}$ fractional-layer superlattices grown on (001) vicinal surfaces by metalorganic chemical vapor deposition" in *Appl. Phys. Letters* 50,824 (1987) and Tsuchiya et al. in *Phys Rev Letters* 62,466 (1989) using stepped surfaces obtained with off axis substrates to produce tilted superlattices. A difficulty with this approach is the propagation of this surface topography through the relatively thick layers required for the cladding layers of a semiconductor laser structure.

A quantum well layer such as GaAs has been grown to fill in a previously etched V-shaped groove in the substrate to form a laser structure. E. Kapon et al., "Quantum Well Lasers Using Patterned Growth", 1988 *IEEE Lasers and Electro-Optics Society Annual Meeting*, Paper OE-2, Kapon et al., "Patterned quantum well semiconductor injection laser grown by molecular beam epitaxy", *Appl. Phys. Letters* 52,607 (1988).

The resulting quantum well layer is thinner on the sides of the groove than near the vertex but the thin sidewall quantum layer is still present. As a result, carrier recombination and lasing in this structure may occur in the quantum well regions on the sides of the groove since these regions are larger and therefore provide more gain than the smaller vertex region. Our invention addresses the elimination of the sidewall growth.

What is desired is a process, particularly as implemented in molecular beam epitaxy (MBE) or metalorganic chemical vapor deposition (MOCVD), wherein ultrafine patterning of ultrathin layers can be achieved in situ without growth interruption by some off-line or nongrowth procedure or process.

There are two examples known to us where patterning may be achieved by quasi-in situ thermal processing wherein thermal etching is employed to selectively remove GaAs. In one example, a n-GaAs layer over a p-AlGaAs layer is first, selectively chemically etched in a particular region followed by thermal etching to remove the remaining thin GaAs left from chemical etching before proceeding with regrowth of the p-AlGaAs layer. This forms a buried reverse biased current confinement mechanism in a double heterostructure laser. H. Tanaka et al, "Single-Longitudinal-Mode Self Aligned AlGa(As) Double-Heterostructure Lasers Fabricated by Molecular Beam Epitaxy", *Japanese Journal of Applied Physics*, Vol. 24, pp. L89–L90, 1985.

In the other example, a GaAs/AlGaAs heterostructure partially masked by a metallic film is thermally etched in an anisotropic manner illustrating submicron capabilities for device fabrication. A. C. Warren et al, "Masked, Anisotropic Thermal Etching and Regrowth for In Situ Patterning of Compound Semiconductors", *Applied Physics Letters*, Vol. 51(22), pp. 1818–1820, Nov. 30, 1987. In both of these examples, AlGaAs masking layers are recognized as an etch stop to provide for the desired geometric configuration in thermally etched GaAs, although it is also known that, given the proper desorption parameters, AlGaAs may also be thermally etched at higher temperatures with different attending ambient conditions vis a vis GaAs.

However, none of these techniques employ in situ photo induced evaporation as a technique in a film deposition system to incrementally reduce, on a minute scale, film thickness in patterned or selective locations at the growth surface either during or after film growth, producing smooth sculptured surface morphology which is a principal objective of this invention.

It is an object of this invention to bring about in situ removal or desorption of selected surface regions or layers of compound semiconductors employing induced evaporation enhancement in metalorganic chemical vapor deposition (MOCVD) epitaxy and to apply this method in the fabrication of semiconductor laser structures with active layers containing in situ fabricated quantum wire.

It is another object of this invention to fabricate a quantum wire layer in a predetermined groove of a semiconductor laser structure and to eliminate the side regions of a deposited quantum well layer in the groove and adjust the lateral dimensions of the quantum well layer to form the quantum wire.

It is an object of this invention to fabricate multiple quantum wire layers, both horizontally or vertically, or in a two-dimensional array of a semiconductor laser structure.

SUMMARY OF THE INVENTION

According to this invention, in situ removal or thinning of portions or all of selected regions of deposited films are brought about by a technique employing an irradiation energy source directed to a spot or region of exposure on the growth surface of a substrate or support in a deposition system, e.g., MBE or MOCVD system. This technique, termed "induced evaporation enhancement", is taught in U.S. Pat. No. 4,962,057.

In particular, the invention herein is directed to the employment of this technique in fabricating in situ quantum wires in semiconductor laser structures wherein induced evaporation enhancement purely removes or prevents the continued growth of the epitaxially deposited materials in selected regions at the growth surface without the need or introduction of masking or chemical etching processes. The application of this technique, as particularly described here, provides the opportunity to produce in situ current reverse bias confinement configurations and impurity induced waveguides which effectively channel current to designated regions of the semiconductor laser structure by means of patterned desorption of layer induced evaporation enhancement.

Other objects and attainments together with a fuller understanding of the invention will become apparent and appreciated by referring to the following description and claims taken in conjunction with the accompanying drawings.

DESCRIPTION OF THE PREFERRED EMBODIMENTS

In describing the devices of this invention, reference is generally made to individual discrete structures although it is generally the case that a plurality of such devices could be fabricated on a wafer substrate in a MOCVD reactor wherein the processing laser beam would be scanned and/or modulated to selected locations to perform the desired induced evaporation enhancement in patterned fashion across the wafer surface.

Figure 1:
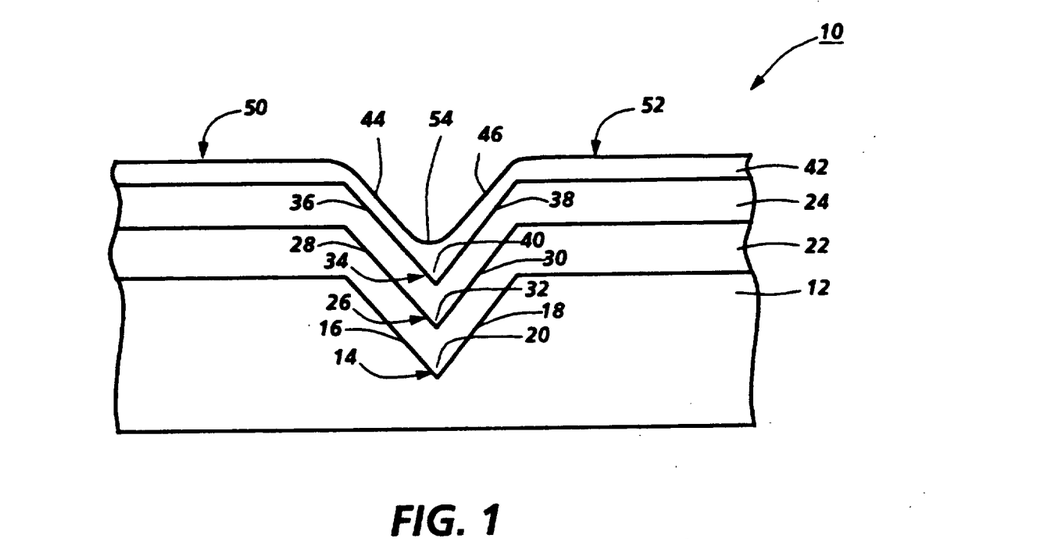
FIG. 1 is a schematic illustration of a side elevation of a quantum wire semiconductor laser structure prior to photo induced desorption formed according to this invention.

Reference is now made to FIG. 1 wherein there is disclosed a semiconductor laser structure 10 having a single quantum wire and fabricated using MOCVD processing as described in incorporated U.S. Pat. No. 4,962,057. Semiconductor laser structure 10 includes a substrate 12 of n-GaAs with an appropriate buffer layer upon which is a groove 14.

The groove can be fabricated in the cladding layer by chemical etching, reactive ion etching, ion milling or other means known to those of ordinary skill in the art. The groove can also be fabricated by a tightly focussed beam scanned across the surface of the cladding layer with changing dwell time, a process described in incorporated U.S. Pat. No. 4,962,057.

In general, the groove should be as narrow as possible. However, the width and depth of the groove will depend upon the process used to fabricate it. It is desirable to form grooves which are deeper than their width with resulting sidewall angles greater than 45 degrees. For example, chemical etching and beam desorption may form grooves in a V-shape with an angular separation of the opposing sidewalls of 70.5 degrees. Reactive ion etching or ion milling may form grooves with widely variable sidewall angles and even grooves with vertical sidewalls. Similarly, etching may form grooves with sidewalls culminating in flat bases.

The optimum sidewall angle of the groove will depend upon the particulars of the semiconductor laser structure. More gradually sloping sidewalls will aid in attaining subsequent high quality epitaxy without voids in the vertex region, and will tend to reflect impinging desorbing radiation out of the groove, thus preventing a concentration of the radiation within the groove. Steeper sidewalls, on the other hand, have the advantages of a smaller dimension at the vertex of the groove for formation of the quantum scale wire, greater redeposition of desorbed material which favors retaining the appropriate amount of material at the vertex and greater shadowing effect as described below.

For the sake of illustration in this embodiment, the groove 14 is V-shaped with opposing acute-angled sidewalls 16 and 18 culminating in vertex 20. The groove can be from 10 nanometers to 2.5 microns deep.

Upon the substrate 12 and groove 14 is epitaxially deposited a first outer cladding layer 22 of n-$Al_xGa_{1-x}As$ and a first inner confinement layer 24 of n-$Al_yGa_{1-y}As$ where $x>y$. Since the growth rate for AlGaAs can be faster on the sidewalls of the groove than at its bottom, the temperature for the growth of layers 22 and 24 is chosen to form and maintain a groove with a sharp vertex in each layer. Thus the outer cladding layer 22 has a V-shaped groove 26 with sidewalls 28 and 30 and vertex 32, parallel to the groove 14 with its sidewalls 16 and 18 in the substrate 12. Inner confinement layer 24 has a V-shaped groove 34 with sidewalls 36 and 38 and vertex 40, parallel to the grooves and sidewalls of the outer cladding layer and the substrate. The grooves are self-aligning since the subsequently deposited layers of uniform thickness will follow the contour of the previously deposited layers.

After growth of layers 22 and 24, an active quantum well layer 42 of GaAs, or $Al_zGa_{1-z}As$ where $z<y$, which provides lightwave generation and propagation under lasing conditions, is grown at a temperature greater than 725° C. so that the growth rate on the sidewalls 44 and 46 of the V-shaped groove 48 is lower than on the horizontal top surfaces, or mesas, 50 and 52, allowing formation of a slightly thicker region 54 at the vertex of the groove as shown in FIG. 1.

Upon completion of the growth of active quantum well layer 42, however, epitaxial growth is temporally discontinued, and as taught in U.S. Pat. No. 4,962,057, the trimethyl-gallium (TMG) source to the MOCVD chamber is turned off, the substrate temperature is increased to about 825° C. and a laser beam or combination laser beam is focussed on the surface of quantum well layer 42 either orthogonally or, as indicated by lines 56 in FIG. 2, at an angle near normal incidence to the sidewalls for a period of time sufficient to thermally evaporate quantum well layer 42 at sidewalls 44 and 46 to the sidewalls 36 and 38 of inner cladding layer 24 at a rate of 1 angstrom per second. The temperature at the illuminated portion of the quantum well layer 42 during the evaporation process may be about 1000° C. to 1030° C.

Figure 2:
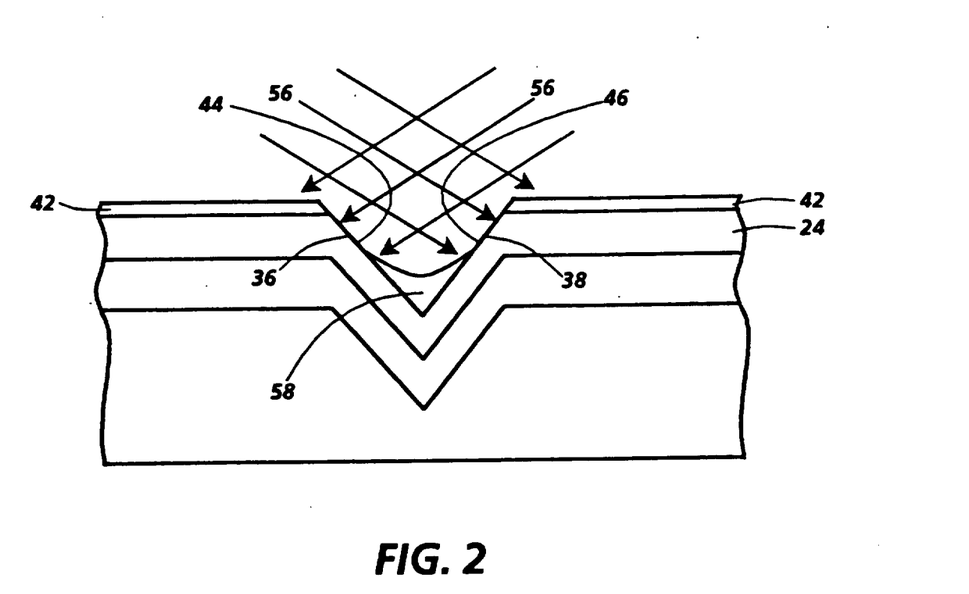
FIG. 2 is a schematic illustration of a side elevation of a quantum wire semiconductor laser structure during photo induced desorption formed according to this invention.

It is well known in the art that at temperatures above about 725° C. the growth of GaAs on sidewalls of a mesa or groove is slower than on the mesa top or at the vertex of the groove and that the difference increases further as the temperature is increased. This behavior implies that the sticking coefficient for Ga and As atoms is smallest on the sidewalls. Hence for near normal incidence of the optical illumination increased temperature is expected to desorb the GaAs of quantum well layer 42 preferentially from the sidewalls 44 and 46 compared to the region 54 at the vertex of the groove 48 and the top mesa areas 50 and 52 of the quantum well layer 42. If the quantum well layer is $Al_zGa_{1-z}As$, the desorption occurs more slowly but is possible at least up to about 10% Al (i.e. $z \leq 0.1$).

By controlling the illumination intensity, the angle and the length of exposure of the laser beam 56, the areas of quantum well layer 42 along the sidewalls 44 and 46 are desorbed down to the interface with inner confinement layer 24 resulting in a crescent shaped quantum wire 58 forming in the vertex 40 of the groove 34 of the inner confinement layer 24. Orienting the polarization of the laser beam parallel to the plane of incidence, which, for example, can be perpendicular to the quantum wire, aids in the removal of undesired material from the surface and sidewalls of the groove, since light will be most effectively coupled into the material. The $Al_yGa_{1-y}As$ of the confinement layer 24 functions as a desorption stop to the optically induced desorption because $Al_yGa_{1-y}As$ where $y \geq 0.15$ is much more difficult to desorb according to this process as compared to the desorption of the GaAs of the quantum well layer 42.

Also, the operating temperature for AlGaAs will be higher than that for GaAs because the Al content in AlGaAs causes a slower evaporation rate since GaAs has a higher vapor pressure than AlGaAs.

The incident angle of the laser beam 56 can also be adjusted to shadow the vertex and concentrate illumination on the sidewalls as shown in FIG. 2. The desorption of the quantum well layer in the shadowed vertex region will proceed more slowly than it would in the presence of illumination since any photochemical desorption will be reduced or eliminated and the vertex region will be cooler than its surrounding sidewalls. Both effects will enhance the lateral selectivity of the desorption. The optical process should be highly reproducible because exposure time and illumination intensity can be accurately controlled.

The method of U.S. Pat. No. 4,962,057 allows growth of the quantum well layer to be performed at a temperature that optimizes the quality of the layer for laser desorption. The desorption can subsequently be accomplished at a base temperature conducive to the preferential thinning of the sidewalls relative to the vertex region. The laser approach to the desorption is preferable to the simple raising of the temperature of the substrate to induce desorption because the intensity of the optical illumination allows for faster control of the semiconductor temperature, shorter desorption times and less time spent at high undesired temperatures. All of these factors greatly enhance the reproducibility of the process using optical illumination.

Figure 3:
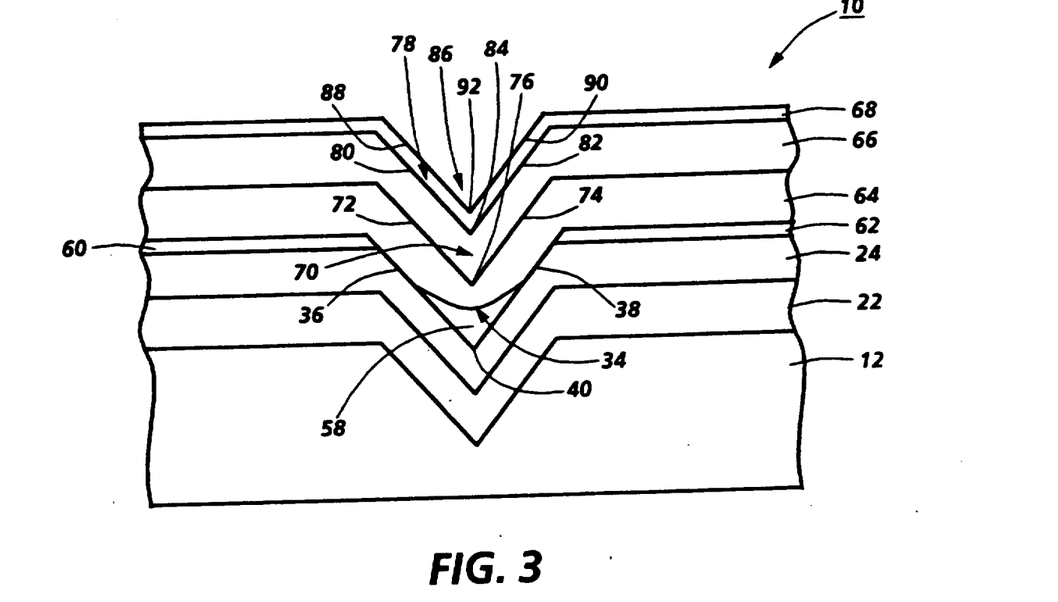
FIG. 3 is a schematic illustration of a side elevation of a quantum wire semiconductor laser structure formed according to this invention.

As shown in FIG. 3, after photo-induced desorption, a crescent shaped quantum wire 58 has formed in vertex 40 of the groove 34 of the inner confinement layer 24, thinned quantum well layers 60 and 62 remain on the mesa levels of inner confinement layer 24 and the quantum well layer no longer exists on the sidewalls 36 and 38 of the groove. Epitaxial growth of semiconductor laser structure 10 is then continued with the growth of a second inner confinement layer 64 of p-$Al_yGa_{1-y}As$ and second outer cladding layer 66 of p-$Al_AGa_{1-A}As$ where $x \geq$ or $\leq A \geq y$ and cap layer 68 of $p^+$-GaAs. Each of these layers provides a uniform thickness on top of the previous semiconductor layers.

The thinned quantum well layers 60 and 62 on the mesa levels do not lase because current is confined to the quantum wire. Alternatively, the layers on the mesas may be removed by the desorbing laser beam.

Thus the inner confinement layer 64 has a V-shaped groove 70 with sidewalls 72 and 74 and vertex 76, parallel to the grooves and sidewalls in the inner confinement layer 24, outer cladding layer 22 and the substrate 12. Outer cladding layer 66 has a V-shaped groove 78 with sidewalls 80 and 82 and vertex 84, parallel to the grooves and sidewalls of the inner confinement layers 64 and 24, outer cladding layer 22 and the substrate 12. Cap layer 68 has a V-shaped groove 86 with sidewalls 88 and 90 and vertex 92, parallel to the grooves and sidewalls of the outer cladding layer 66, inner confinement layers 64 and 24, outer cladding layer 22 and the substrate 12.

Once again, the grooves are self-aligning since the subsequently deposited layers of uniform thickness will follow the contour of the previously deposited layers. The GaAs of the quantum well layer grows faster at the bottom vertex of the groove while the AlGaAs of the cladding layer grows faster on the sidewalls of the groove, thus the groove is reformed in the AlGaAs cladding layer after each GaAs quantum wire crescent.

However, the inner confinement layer 64, the outer cladding layer 66 and the cap layer 68 are not required to follow the grooves and sidewalls of the lower layers.

The quantum well layer 42 and resulting quantum wire 58 can be of low bandgap semiconductor material with the adjacent inner confinement layers 24 and 64 of high bandgap semiconductor material to reduce carrier and radiation lossses and to localize carriers to adjacent quantum wires in multiple quantum wire semiconductor laser structures described below.

Standard chemical etching means or other metallization techniques as are known in the art are employed to form a p-contact on the cap layer 12 and a n-contact on the substrate 68 (not shown). The p-cladding layer 66 and the n-cladding layer 22 form a p-n junction with the quantum wire 58 therebetween. Current is injected between the p-contact and the n-contact to forward-bias the p-n junction of p-cladding layer 66 and the n-cladding layer 22 to cause the active quantum wire 58 to emit coherent light.

The processing techniques in U.S. Pat. No. 4,962,057 permit the full in situ processing of a quantum wire semiconductor laser structure 10 without removal of the structure from the MOCVD reactor or movement or masking of the structure in the reactor.

Figure 4:
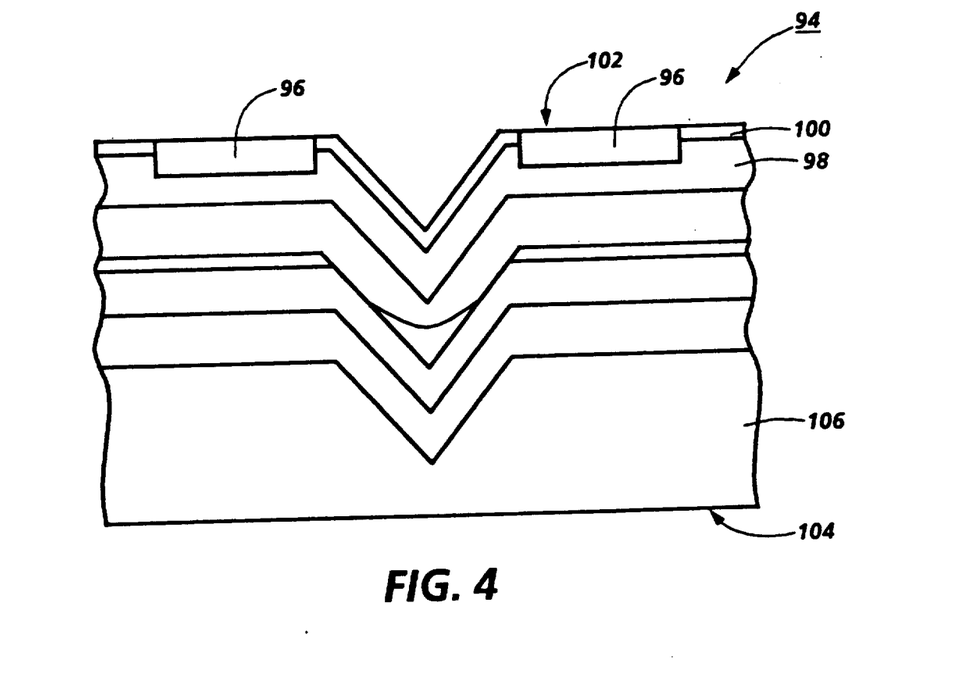
FIG. 4 is a schematic illustration of an alternate embodiment of the quantum wire semiconductor laser structure with an external current confinement stripe formed according to this invention.

In FIG. 4, the quantum wire semiconductor laser structure 94 is of identical structure to the quantum wire semiconductor laser structure 10 of FIG. 3, except that a current confinement stripe is formed by proton bombardment or ion implantation regions 96 through the cap layer 100 of p-GaAs and into the second outer cladding layer 98 of p-AlGaAs, as is known in the art. Appropriate contact metals are then applied to the outer surface 102 of the cap layer 100 and outer surface 104 of the substrate 106, also as known in the art.

Figure 5:
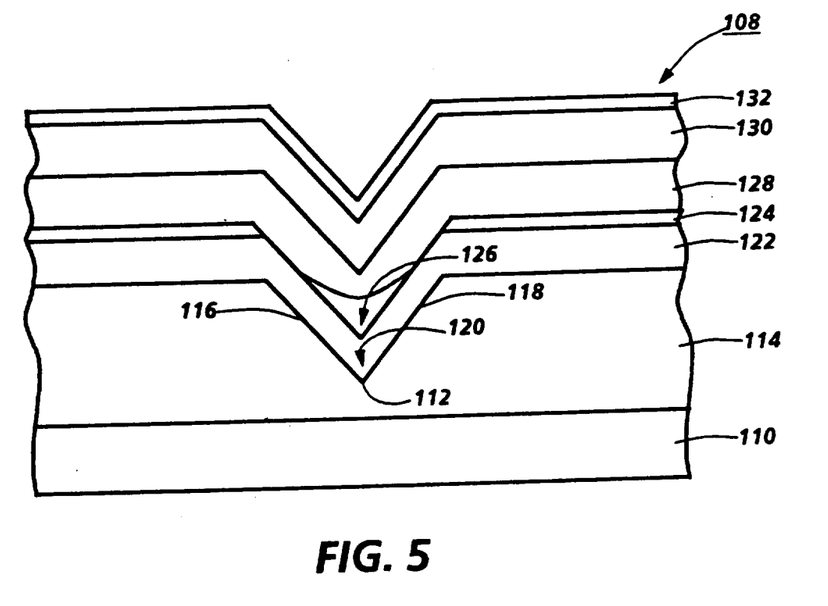
FIG. 5 is a schematic illustration of an alternate embodiment of the quantum wire semiconductor laser structure with the initial groove in the first grown cladding layer formed according to this invention.

In FIG. 5, the quantum wire semiconductor laser structure 108 is of identical structure to the quantum wire semiconductor laser structure 10 of FIG. 3, except that the substrate 110 of n-GaAs is flat and the groove 112 is fabricated in the fisrt outer cladding layer 114 of n-Al$_x$Ga$_{1-x}$As. The groove can be fabricated by a tightly focussed beam scanned across the surface of the outer cladding layer with changing dwell time, a process described in incorporated U.S. Pat. No. 4,962,057. For the sake of illustration in this embodiment, the groove 112 is V-shaped with opposing acute-angled sidewalls 116 and 118 culminating in a vertex 120.

After fabrication of the groove 112, the quantum wire semiconductor laser 108 is fabricated in the identical fashion as the quantum wire semiconductor laser 10 as previously taught in this application and as shown in FIGS. 1 to 3. A first inner confinement layer 122 of n-Al$_y$Ga$_{1-y}$As where x>y is epitaxially deposited on the outer cladding layer 112 following the contour of the groove. An active quantum well layer 124 of GaAs, or Al$_z$Ga$_{1-z}$As where z<y, which provides lightwave generation and propagation under lasing conditions, is grown over the inner confinement layer 122 and photo-induced desorption forms a crescent-shaped quantum wire 126. Epitaxial growth is then continued with the growth of a second inner confinement layer 128 of p-Al$_y$Ga$_{1-y}$As and second outer cladding layer 130 of p-Al$_A$Ga$_{1-A}$As where x≧or≦A≧y and cap layer 132 of p+-GaAs.

Figure 6:
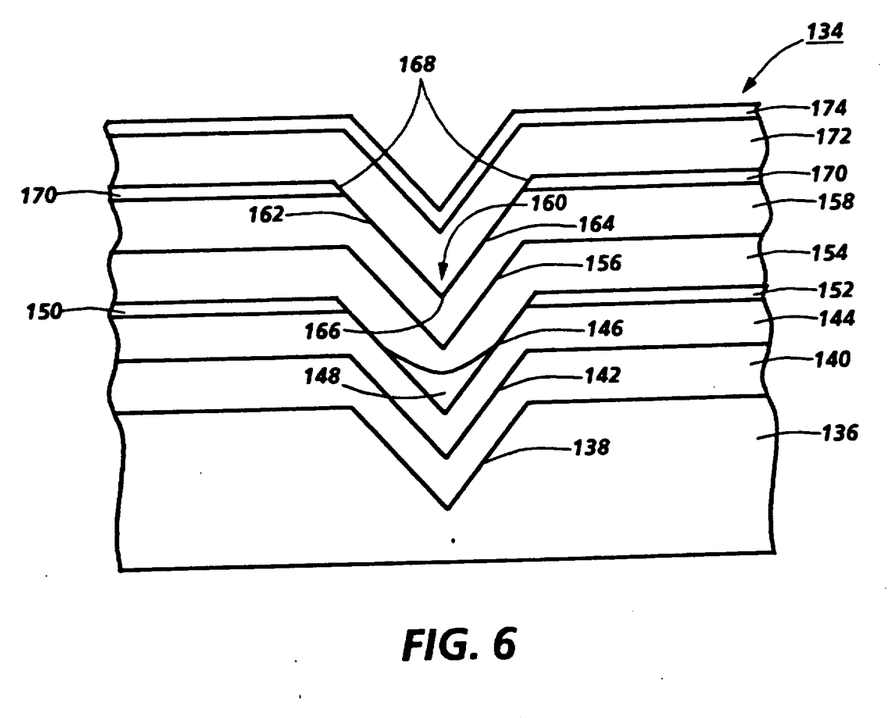
FIG. 6 is a schematic illustration of a side elevation of a quantum wire semiconductor laser structure with a reverse bias junction formed according to this invention.
Figure 7:
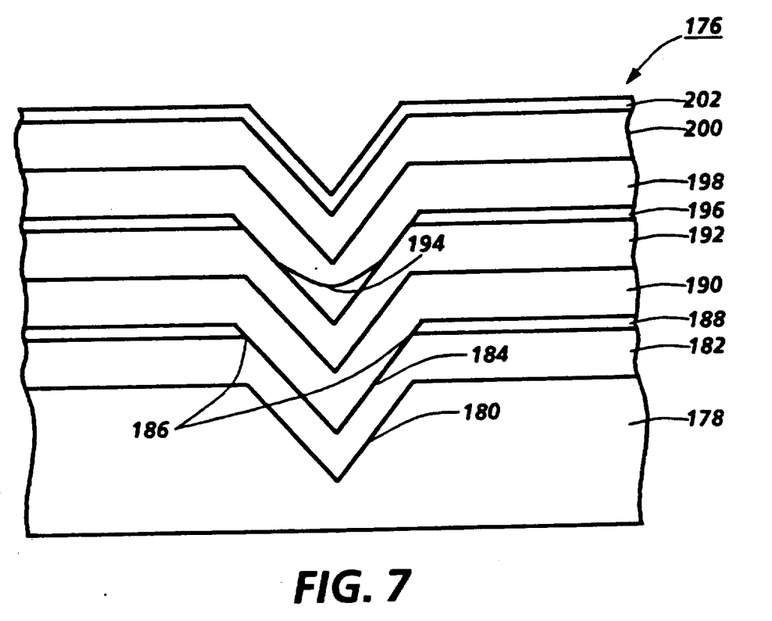
FIG. 7 is a schematic illustration of a side elevation of an alternate embodiment of a quantum wire semiconductor laser structure with a reverse bias junction formed according to this invention.
Figure 8:
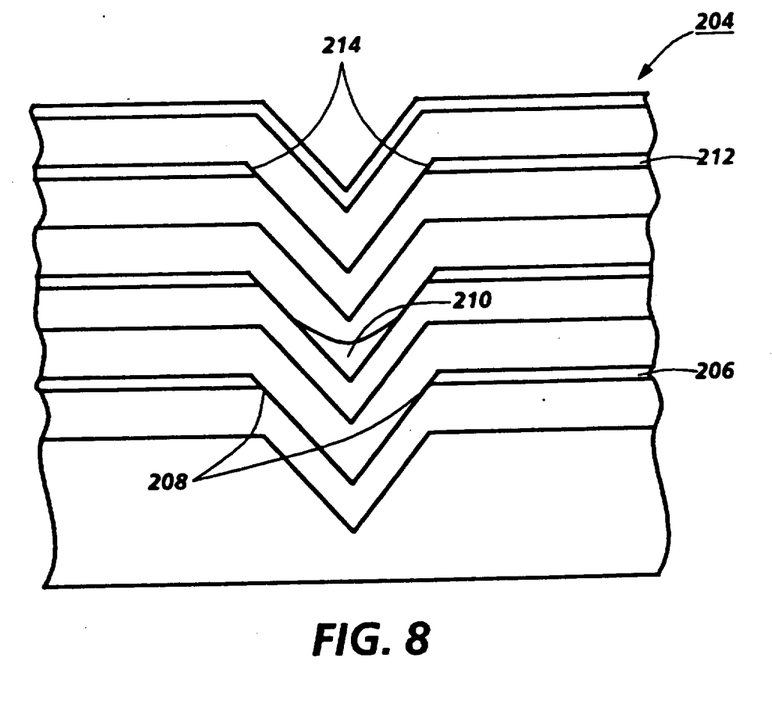
FIG. 8 is a schematic illustration of a side elevation of an alternate embodiment of a quantum wire semiconductor laser structure with a reverse bias junction formed according to this invention.

FIGS. 6, 7 and 8 disclose a quantum wire semiconductor laser structure including a reverse bias junction in the cladding region of the laser for purposes of current confinement and a buried quantum wire, both of which are formed in situ during epitaxial growth employing induced evaporation enhancement.

In FIG. 6, reverse bias junction quantum wire semiconductor laser 134 includes a substrate 136 of n-GaAs upon which is a V-shaped groove 138. Upon the substrate and groove is epitaxially deposited a first outer cladding layer 140 of n-Al$_x$Ga$_{1-x}$As forming a groove 142, first inner confinement layer 144 of n-Al$_y$Ga$_{1-y}$As where x>y forming a groove 146 and an active quantum well layer of GaAs, as previously taught in this application.

Upon completion of the growth of active quantum well layer, however, epitaxial growth is temporarily discontinued, and as previously taught in this application, a quantum wire 148 in the vertex of the groove and thinned quantum layers 150 and 152 on the mesa of the semiconductor layers are fabricated by a focused laser beam locally desorbing the epitaxial grown quantum well layer. Epitaxial growth is then continued with the growth of second inner confinement layer 154 of p-Al$_y$Ga$_{1-y}$As forming a groove 156 and second outer cladding layer 158 of p-Al$_A$Ga$_{1-A}$As where x≧or≦A≧y forming a V-shaped groove 160 with opposing acute angled sidewalls 162 and 164 meeting at vertex 166, above and aligned with the grooves of the previous layers.

A n-type doped quantum well layer of n-GaAs heavy doped, for example with Si or Se, is then grown on outer cladding layer 158 as taught in incorporated U.S. Pat. No. 4,962,057.

After the growth of the doped quantum well layer, the growth of the semiconductor layers is temporarily discontinued, a laser beam is focussed on the central region of the doped quantum well layer above the V-shaped grooves 160, 156, 146, 142 and 138 and quantum wire 148 to provide a temperature gradient sufficient to induce the desorption of a strip in the doped quantum well layer down to the interface with outer cladding layer 158 at sidewalls 162 and 164 forming a current channel 168 in the quantum well layer. The Al$_A$Ga$_{1-A}$As of the outer cladding layer 158 functions as a desorption stop to the optically patterned desorption at the interface because AlGaAs is more difficult to desorb compared to the n-doped GaAs quantum well layer.

As an example, for a period of 300 seconds, GaAs is desorbed at channel 168 at a rate of about 0.03 nanometers per second with a temperature of approximately 1030° C. from a spot focussed to a diameter slightly larger than the width of the groove 156. The n-GaAs is desorbed from the sidewalls more rapidly than from the flat mesa top so that channel 168 is completely opened.

After formation of current channel 168 by induced evaporation enhancement of the region of doped quantum well layer, the doped quantum well layer remaining on the mesas of the outer confinement layer forms a reverse bias junction configuration or blocking layer 170. Epitaxial growth is continued with the growth of outer cladding layer 172 of p-Al$_B$Ga$_{1-B}$As where $x \geq A \geq$ or $\leq B > y$, followed by the growth of cap layer 174 of Mg doped p+-GaAs.

Standard chemical etching means or other metallization techniques as are known in the art are employed to form a p-contact on the cap layer 174 and a n-contact on the substrate 136 (not shown). The p-cladding layer 158 and the n-cladding layer 140 form a p-n junction with the quantum wire 148 therebetween. Current is injected between the p-contact and the n-contact to forward-bias the p-n junction of p-cladding layer 158 and the n-cladding layer 140 to cause the active quantum wire 148 to emit coherent light.

The reverse bias junction 170 in combination with the adjacent cladding layers 158 and 172 can function as an optical waveguide which is self-aligned with the current channel 168 and quantum wire active region 148.

As an example, layers 158 and 172 may both be comprised of Al$_{0.8}$Ga$_{0.2}$As. This optical waveguide structure with the reverse bias junction 170 provides for an index guide that has emphasis on lateral waveguiding properties. On the other hand, with B<A, an antiguiding optical waveguide structure can be created in conjunction with reverse biased junction configuration 170, e.g., layer 158 may be Al$_{0.8}$Ga$_{0.2}$As and layer 172 may be Al$_{0.1}$Ga$_{0.9}$As. This antiguiding structure enables high power operation in a stable mode by spreading optical power across a large lateral dimension at the output facet of the laser structure.

In FIG. 7, the reverse bias junction quantum wire semiconductor laser 176 is identical in structure to laser 134 of FIG. 6 except that the current channel and reverse bias junction are on the n-side of the quantum wire.

Thus, the reverse bias junction quantum wire semiconductor laser 176 includes a substrate 178 of n-GaAs upon which is a V-shaped groove 180. Upon the substrate and groove is epitaxially deposited an outer cladding layer 182 of n-Al$_x$Ga$_{1-x}$As forming a groove 184 and then a p-type doped quantum well layer of p-GaAs heavy doped, for example with Mg or C.

After the growth of the doped quantum well layer, the growth of the semiconductor layers is temporarily discontinued, a laser beam is focussed on the central region of the doped quantum well layer above the V-shaped grooves 184 and 180 to provide a temperature gradient sufficient to induce the desorption of a strip in the doped quantum well layer down to the interface with the cladding layer 182 forming a current channel 186 in the quantum well layer.

After formation of current channel 186 by induced evaporation enhancement of the region of doped quantum well layer, the doped quantum well layer remaining on the mesas of the outer cladding layer forms a reverse bias junction configuration or blocking layer 188. Epitaxial growth is continued with the epitaxial growth of first outer cladding layer 190 of n-Al$_w$Ga$_{1-w}$As where $w \leq x$ and first inner confinement layer 192 of n-Al$_z$Ga$_{1-z}$As where $x \geq w > z$ and thence quantum wire 194 of GaAs and thinned quantum well layers 196 of GaAs and thence the sequential growth of a second inner confinement layer 198 of p-Al$_y$Ga$_{1-y}$As and second outer cladding layer 200 of p-Al$_A$Ga$_{1-A}$As where $x \geq$ or $\leq A > y$ and cap layer 202 of p+-GaAs, as taught previously in this application.

As with the reverse bias junction of FIG. 6, the composition of the adjacent cladding layers with the reverse bias junction of FIG. 7 may provide an optical waveguide of either an index guide or an antiguiding structure.

In FIG. 8, the reverse bias junction quantum wire semiconductor laser 204 is identical in structure to laser 134 of FIG. 6 and laser 176 of FIG. 7 except that the current channel and reverse bias junction are on both the n- and p-sides of the quantum wire.

Thus, the reverse bias junction quantum wire semiconductor laser 204 has a n-side reverse bias junction 206 and corresponding current channel 208, a quantum wire 210, and a p-side reverse bias junction 212 and corresponding current channel 214.

The blocking layer and current channel in a reverse bias junction quantum wire semiconductor lasers can be located between other layers in the semiconductor as is known to those of skill in the art. FIGS. 6, 7 and 8 are merely illustrative examples.

Figure 9:
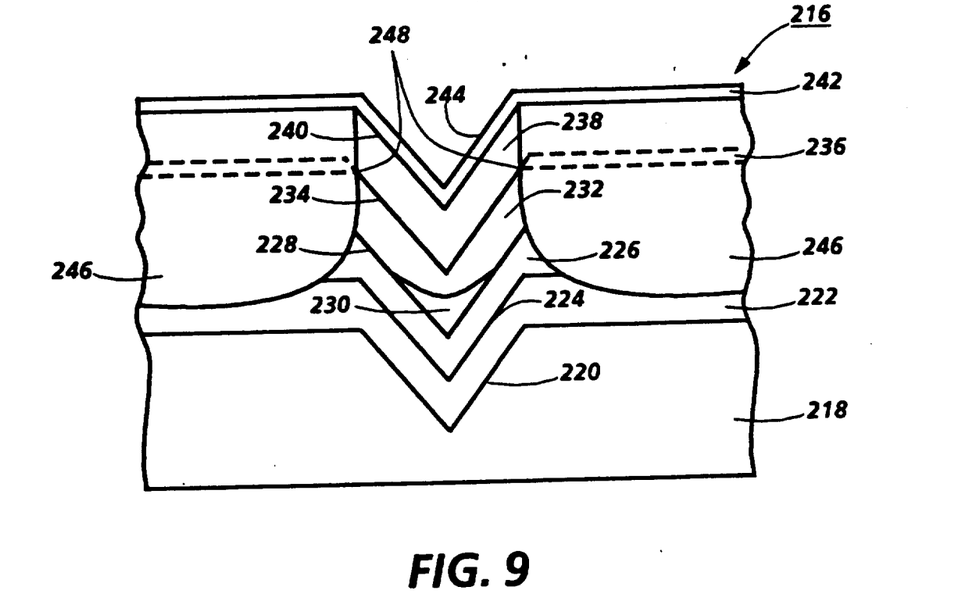
FIG. 9 is a schematic illustration of a side elevation of a quantum wire semiconductor laser structure with an optical waveguide formed according to this invention.

FIG. 9 discloses a quantum wire semiconductor laser structure including an optical waveguide and a buried quantum wire, both of which are formed in situ during epitaxial growth employing induced evaporation enhancement.

The semiconductor laser structure 216 includes a substrate 218 of n-GaAs, with a V-shaped groove 220, upon which is epitaxially deposited a first outer cladding layer 222 of n-Al$_x$Ga$_{1-x}$As, forming a groove 224; a first inner confinement layer 226 of n-Al$_y$Ga$_{1-y}$As where $x > y$, forming a groove 228; an active quantum wire 230 of GaAs within the groove 228, fabricated by means previously taught in this application, a second inner confinement layer 232 of p-Al$_y$Ga$_{1-y}$As, forming a groove 234 and an impurity source layer 236 comprising n-GaAs heavily doped, for example, with Si or Se at a concentration in excess of $10^{19}/cm^3$ or up to a point of saturated concentration of the Si or Se elemental constituent in GaAs. Impurity source layer 236 is shown thick broken lines in FIG. 9 to emphasize its higher dopant property. Impurity source layer 236 may be very thin, i.e. of quantum well size such as 7.5 nm, and may also be, alternatively alone or in alternate combination therewith, a Si or Se spike comprising one or more atomic monolayers thick.

After the growth of impurity source layer 236, epitaxial growth is temporarily discontinued, the temperature of the substrate is increased if necessary, the metalorganic sources are vented, a 1% arsine/hydrogen mixture is introduced into the MOCVD chamber and a laser beam is focussed to the central region of impurity source layer 236 to provide a temperature gradient sufficient to induce the desorption of a linear stripe in the source layer 236 down to the interface with second inner confinement layer 232 forming a channel in layer 236 as taught in incorporated U.S. Pat. No. 4,962,057.

The Al$_y$Ga$_{1-y}$As of confinement layer 232 functions as a desorption stop to the optical patterned desorption at the channel because AlGaAs is much more difficult to desorb compared to GaAs in employing the technique of induced evaporation enhancement. The substrate temperature during the desorption may be increased from 800° C. to 825° C. or 850° C. to reduce the laser power required for removal. The portion of the GaAs impurity source layer 236 desorbed in the region of the channel being very thin, such as in the range of 5 to 10 nanometers, so it may be removed in a relatively short period of time, e.g., several hundreds of seconds.

Experience has shown that a 7.5 nanometer thick quantum well layer can be removed in about 300 seconds.

If the temperature is changed during the desorption process, then the temperature at the growth region is returned to 800° C. and growth is continued with the epitaxial growth of second outer cladding layer 238 of p-Al$_A$Ga$_{1-A}$As where x≧A>y forming a groove 240 and cap layer 242 of p+-GaAs forming a groove 244.

The disordering source layer 236 is activated by some combination of annealing that will occur during growth of the last two semiconductor layers 238 and 242. Diffusion of impurity species, such as Si or Se, from source layer 236 causes the interdiffusion of Ga and Al and the formation of disordered regions 246 as illustrated in FIG. 9 from the outer cladding layer 238 through the other semiconductor layers to the first outer cladding layer 222. An optical waveguide 236 is thus formed in semiconductor laser structure 216 between the disordered regions 246, aligned with the quantum wire 230 in the nondisordered regions of the semiconductor layers.

Standard chemical etching means or other metallization techniques as are known in the art are employed to form a p-contact on the cap layer 242 and a n-contact on the substrate 218 (not shown). The p-cladding layer 238 and the n-cladding layer 222 form a p-n junction with the quantum wire 230 therebetween. Current is injected between the p-contact and the n-contact to forward-bias the p-n junction of p-cladding layer 238 and the n-cladding layer 222 to cause the active quantum wire 230 to emit coherent light.

Figure 10:
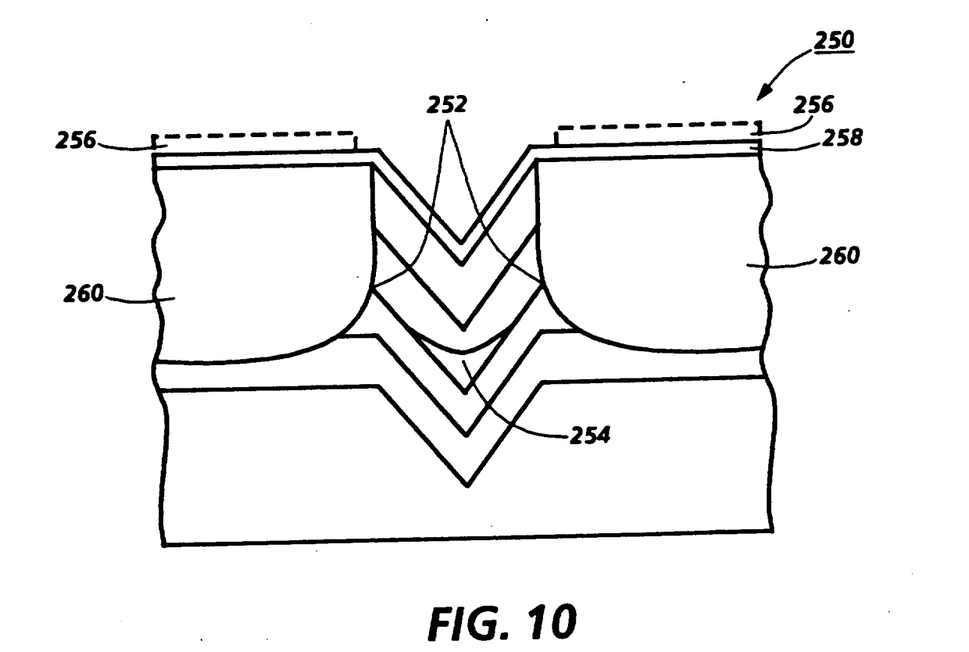
FIG. 10 is a schematic illustration of a side elevation of an alternate embodiment of a quantum wire semiconductor laser structure with an optical waveguide formed according to this invention.

In FIG. 10, the quantum wire semiconductor laser structure 250 including an optical waveguide 252 and a buried quantum wire 254 is identical in structure to the quantum wire semiconductor laser structure 216 of FIG. 9 except that the disordering impurity source layer 256 of FIG. 10 is epitaxially deposited on the cap layer 258 of p+-GaAs or directly on the second cladding layer.

The annealing step to form the disordered regions 260 from the disordering source layer is carried out after the epitaxial growth of the semiconductor structure within the reactor (not shown) or can be carried out in an annealing furnace (also not shown) after the semiconductor structure 250 is removed from the reactor (not shown). The channel in the disordering impurity source layer can be formed by the desorption method previously discussed in this application or by etching or other means known to those of skill in the art.

Figure 11:
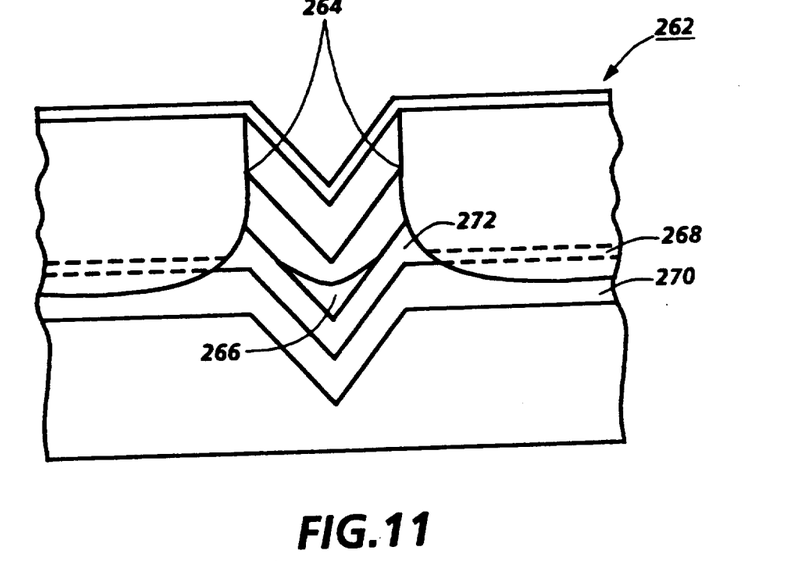
FIG. 11 is a schematic illustration of a side elevation of an alternate embodiment of a quantum wire semiconductor laser structure with an optical waveguide formed according to this invention.

In FIG. 11, the quantum wire semiconductor laser structure 262 including an optical waveguide 264 and a buried quantum wire 266 is identical in structure to the quantum wire semiconductor laser structure 216 of FIG. 9 except that the disordering impurity source layer 268 of FIG. 11 is epitaxially deposited between the first outer cladding layer 270 of n-Al$_x$Ga$_{1-x}$As and the first inner confinement layer 272 of n-Al$_y$Ga$_{1-y}$As where x>y. The impurity source layer 268 could comprise n-GaAs heavily doped, for example, with Zn up to a point of saturated concentration of the Zn elemental constituent in GaAs. Zn moves faster than Si and so would therefore be likely to disorder the subsequently epitaxially deposited semiconductor layers during the growth of those remaining layers.

Impurity induced disordering has the additional benefit of eliminating most, if not all, of the quantum well layer remaining on top of the mesas after the desorption. The addition of the layer disordering regions also provides a measure of current confinement.

Figure 12:
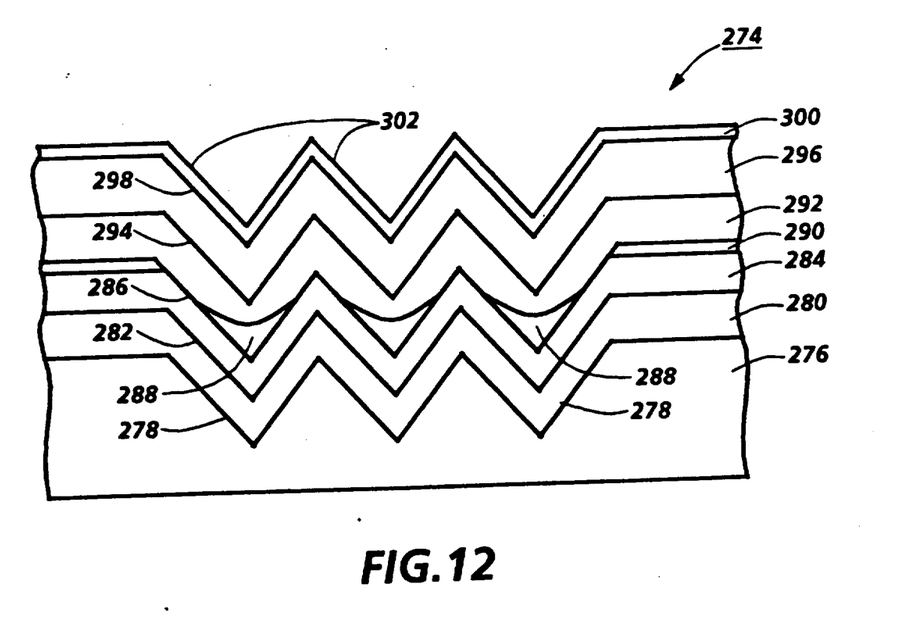
FIG. 12 is a schematic illustration of a side elevation of a linear or horizontal multiple quantum wire semiconductor laser formed according to this invention.

FIG. 12 discloses a semiconductor laser structure with a series of linear or horizontal multiple quantum wires. The horizontal multiple quantum wire semiconductor laser structure 274 includes a single substrate 276 of n-GaAs, upon which multiple V-shaped grooves 278 have been fabricated in series.

Upon the substrate and V-shaped grooves is epitaxially deposited a first outer cladding layer 280 of n-Al$_x$Ga$_{1-x}$As forming multiple grooves 282 aligned with grooves 276; a first inner confinement layer 284 of n-Al$_y$Ga$_{1-y}$As where x>y forming multiple grooves 286 aligned with grooves 282 and 276; and active quantum wires 288 of GaAs, each cresent shaped in the V-shaped grooves 286 fabricated by means previously taught in this application. The desorbing laser beam can either be a single laser beam or combination beam working in sequence, or more appropriately, multiple laser beams or combination laser beams working in parallel.

A thinned quantum well layer 290 remains on the mesas of the inner confinement layer 284 and thence the sequential growth of a second inner confinement layer 292 of p-Al$_y$Ga$_{1-y}$As forming multiple grooves 294 aligned with the grooves 286, 282 and 278; second outer cladding layer 296 of p-Al$_A$Ga$_{1-A}$As where x≧ or ≦A>y forming multiple grooves 298 aligned with grooves 294, 286, 282 and 278; and cap layer 300 of p+-GaAs forming multiple grooves 302 aligned with grooves 298, 294, 286, 282 and 278. Multiple active quantum wires provide more modal gain for the laser cavity as compared to single quantum wire active regions.

Standard chemical etching means or other metallization techniques as are known in the art are employed to form a p-contact on the cap layer 300 and a n-contact on the substrate 276 (not shown). The p-cladding layer 296 and the n-cladding layer 280 form a p-n junction with the quantum wires 288 therebetween. Current is injected between the p-contact and the n-contact to forward-bias the p-n junction of p-cladding layer 296 and the n-cladding layer 280 to cause the active quantum wires 288 to emit coherent light.

Figure 13:
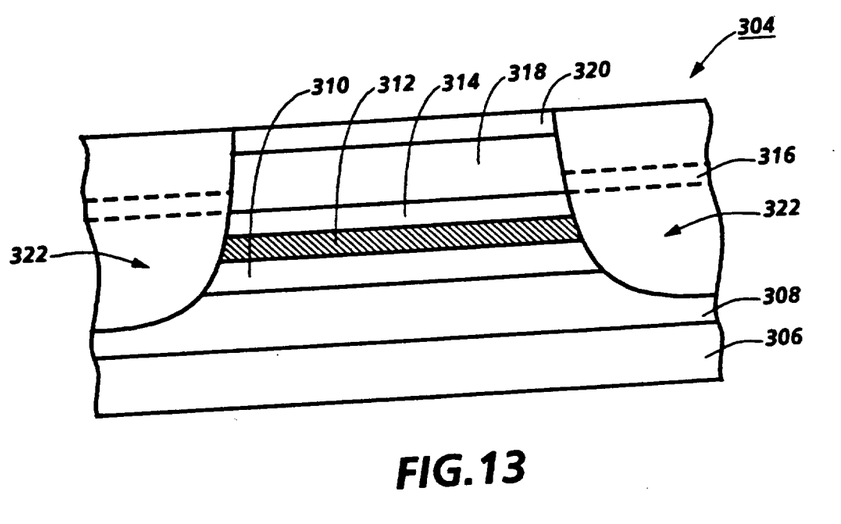
FIG. 13 is a schematic illustration of a side elevation of an alternate embodiment of a linear or horizontal multiple quantum wire semiconductor laser structure wherein the light output is perpendicular to the axis of the multiple quantum wires formed according to this invention.

FIG. 13 discloses an alternate embodiment of a semiconductor laser structure with a series of linear or horizontal multiple quantum wires wherein the light output is perpendicular to the axis of the multiple quantum wires. The horizontal multiple quantum wire semiconductor laser structure 304 includes a single substrate 306 of n-GaAs with grooves (not shown). The grooves in this and subsequent layers are not shown in this perspective of this Figure but are aligned as described with regard to the multiple quantum wire semiconductor laser of FIG. 12.

Upon the substrate and grooves (not shown) is epitaxially deposited a first outer cladding layer 308 of n-Al$_x$Ga$_{1-x}$As forming multiple grooves (not shown); a first inner confinement layer 310 of n-Al$_y$Ga$_{1-y}$As where x>y forming multiple grooves (not shown); and active quantum wires 312 of GaAs, oriented from left to right, linear in this perspective in the grooves of the first inner confinement layer (not shown) fabricated by means previously taught in this application. The desorbing laser beam can either be a single laser beam or combination beam working in sequence, or more appropriately, multiple laser beams or combination laser beams working in parallel.

A thinned quantum well layer (not shown) remains on the mesas (also not shown) of the first inner confinement layer 310 and thence the sequential growth of a second inner confinement layer 314 of p-Al$_y$Ga$_{1-y}$As forming multiple grooves (not shown) and an impurity source layer 316 comprising heavily doped n-GaAs as previously taught in this application. Impurity source layer 316 is shown thick broken lines in FIG. 13 to emphasize its higher dopant property.

The impurity source is either deposited on the second inner confinement layer 314 in linear stripes perpendicular to the quantum wires leaving a linear stripe section in the source layer free of the impurity source to form an array of quantum wire lasers or the impurity source is deposited over the entire second inner layer and a linear stripe in the source layer is desorbed over a section of the quantum wires to form a single laser, perpendicular to the quantum wires, as previously taught in this application.

The epitaxial growth continues with the deposition of the second outer cladding layer 318 of p-Al$_A$Ga$_{1-A}$As where x ≧ A > y forming multiple grooves (not shown) and cap layer 320 of p+-GaAs forming multiple grooves (also not shown). As discussed with regard to the disordering in FIG. 9, annealing of the impurity disordering source 316 during the epitaxial growth of the last two semiconductor layers 318 and 320 causes impurity induced diffusion of impurity species from source layer 316 with the interdiffusion of Ga and Al and the formation of disordered regions 322 as illustrated in FIG. 13 from the second outer cladding layer 318 through the other semiconductor layers to the first outer cladding layer 308. Alternately, as shown in FIGS. 10 and 11, the impurity disordering source layer can be deposited on the cap layer, or on the second outer cladding layer, or between the first cladding and first confinement layers to produce the disordered regions.

Figure 14:
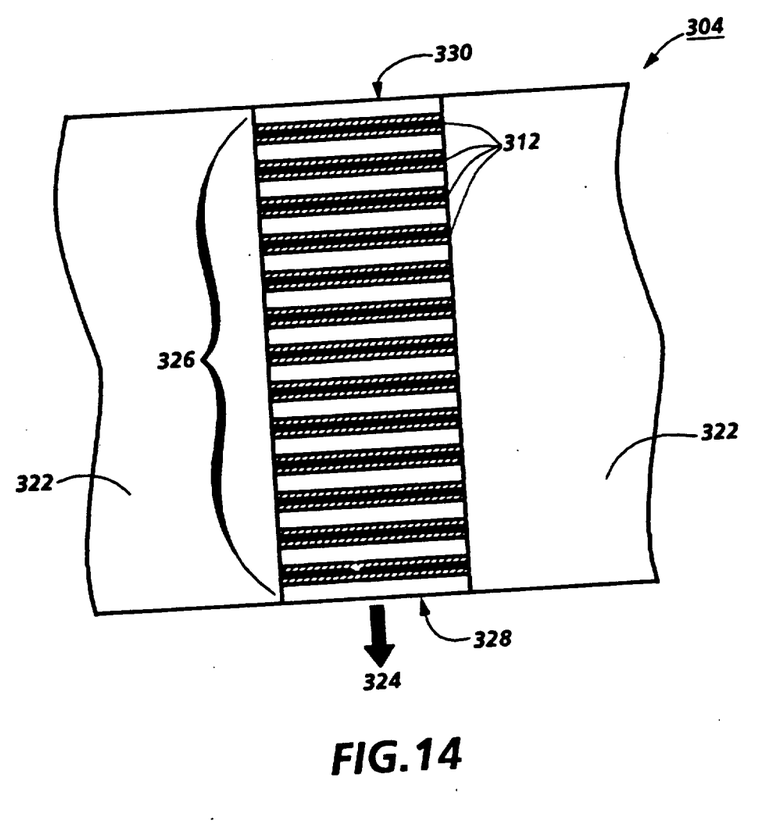
FIG. 14 is a schematic illustration of a top elevation of the linear or horizontal multiple quantum wire semiconductor laser structure of FIG. 13.

As best seen in the top view of FIG. 14, the multiple quantum wire semiconductor laser structure 304 includes a linear or horizontal series of quantum wires 312 for lightwave generation and propagation under lasing conditions bounded between by impurity disordered regions 322. Lightwave generation and propagation, as indicated by arrow 324, is perpendicular to the disordered region bounded quantum wires. The uniform active layer of the previous embodiments running the lengths of the quantum wire is replaced by an active layer covering only the widths of the quantum wires 312 with the inner confinement layers 310 and 314 between the quantum wires. The optical gain is localized to the quantum wires. The optical cavity 326 of the laser has a corrugated active layer from front laser mirror 328 to rear laser mirror 330. This orientation may provide the highest gain for a multiple quantum wire semiconductor laser structure since the radiative transition rate is largest for an optical field polarized along the quantum wire, i.e. corresponding to the preferred mode (TE) of the optical cavity.

Standard chemical etching means or other metallization techniques as are known in the art are employed to form a p-contact on the cap layer 320 and a n-contact on the substrate 310 (not shown). The p-cladding layer 318 and the n-cladding layer 308 form a p-n junction with the quantum wires 312 therebetween. Current is injected between the p-contact and the n-contact to forward-bias the p-n junction of p-cladding layer 318 and the n-cladding layer 308 to cause the optical cavity 326 to emit coherent light.

The quantum wires can also be spaced at λ/2 to form a distributed feedback (DFB) structure and thereby eliminate the necessity for the cleaved laser end mirrors.

Figure 15:
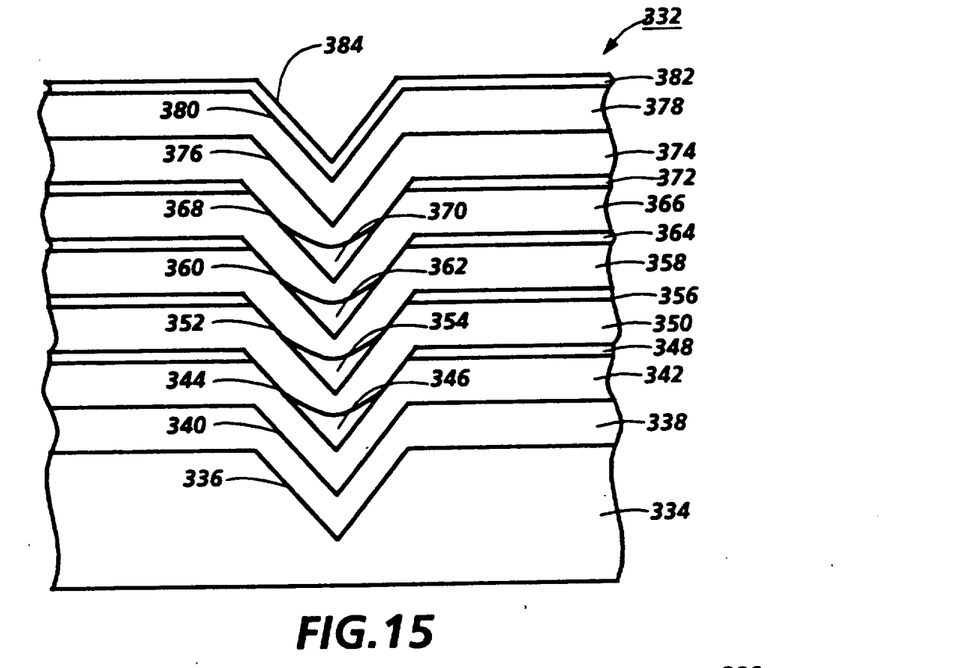
FIG. 15 is a schematic illustration of a side elevation of a vertical multiple quantum wire semiconductor laser formed according to this invention.

FIG. 15 discloses a semiconductor laser 322 with a series of sequential grown vertical quantum wells above a single groove in the substrate. The vertical multiple quantum wire semiconductor laser structure 322 includes a single substrate 334 of n-GaAs, upon which a single groove 336 has been fabricated. Upon the substrate and groove is epitaxially deposited a first outer cladding layer 338 of n-Al$_x$Ga$_{1-x}$As forming a groove 340 aligned with groove 336; a first inner confinement layer 342 of n-Al$_y$Ga$_{1-y}$As where x > y forms a groove 344 aligned with the previous grooves; and active quantum wire 346 of GaAs fabricated by means previously taught in this application at the vertex of the groove 344.

A thinned quantum well layer 348 remains on top of the inner confinement layer 342. A barrier layer 350 of Al$_C$Ga$_{1-C}$As where C ≦ y is then epitaxially deposited over the exposed surfaces of the quantum well layer 348, the groove 344 of the inner confinement layer 342 and the quantum wire 346, forming a groove 352 aligned with the previous grooves.

Another quantum well layer is grown on top of the barrier layer 350 and photo induced desorbed by means previously taught in this application leaving a quantum wire 354 at the vertex of the groove 352 and a thinned quantum well layer 356 on top of the barrier layer 308.

Another barrier layer 358 is deposited forming a groove 360 aligned with the previous grooves, followed by a quantum well layer being deposited, which is desorbed to leave a quantum wire 362 at the vertex of the groove 360, and a thinned quantum well layer 364 on top of the barrier layer 358.

Another barrier layer 366 is deposited forming a groove 368 aligned with the previous grooves, followed by a quantum well layer being deposited, which is desorbed to leave a quantum wire 370 at the vertex of the groove 368, and a thinned quantum well layer 372 on top of the barrier layer 366.

Epitaxial growth is then continued with the growth of a second inner confinement layer 374 of p-Al$_y$Ga$_{1-y}$As forming a groove 376 aligned with the previous grooves and second outer cladding layer 378 of p-Al$_A$Ga$_{1-A}$As where x ≧ or ≦ A ≧ y forming a groove 380 aligned with the previous grooves and cap layer 382 of p+ —GaAs forming a groove 384 aligned with the previous grooves.

Standard chemical etching means or other metallization techniques as are known in the art are employed to form a p-contact on the cap layer 382 and a n-contact on the substrate 334 (not shown). The p-cladding layer 378 and the n-cladding layer 338 form a p-n junction with the quantum wires 370, 362, 354, and 346 therebetween. Current is injected between the p-contact and the n-contact to forward-bias the p-n junction of p-cladding layer 378 and the n-cladding layer 338 to cause the active quantum wires 370, 362, 354, and 346 to emit coherent light. The barrier layers do not affect the p-n junction's ability to forward-bias the quantum wires and to emit light.

Current confinement can be provided with a reverse bias layer, as taught previously, on the substrate or n-side, on the p-side, or on both sides of the quantum wires. Optical waveguides, also as previously taught, can be provided for this embodiment.

In this Figure, the barrier layer follows the contour of the previous cladding or barrier layer. Thus, since there is a groove in the cladding layer, an aligned groove will form in the barrier layer when the barrier layer is epitaxially deposited on top of the cladding layer.

The sequentially grown quantum wires of FIG. 15 are all self-aligned by the formation of the grooves. This growth sequence of alternating barrier layers and quantum well layers to be desorbed into quantum wires in the vertex of the grooves of the barrier layers can be repeated to form as many quantum wires as desired. Multiple active quantum wires provide more modal gain for the laser cavity as compared to single quantum wire active regions.

Figure 16:
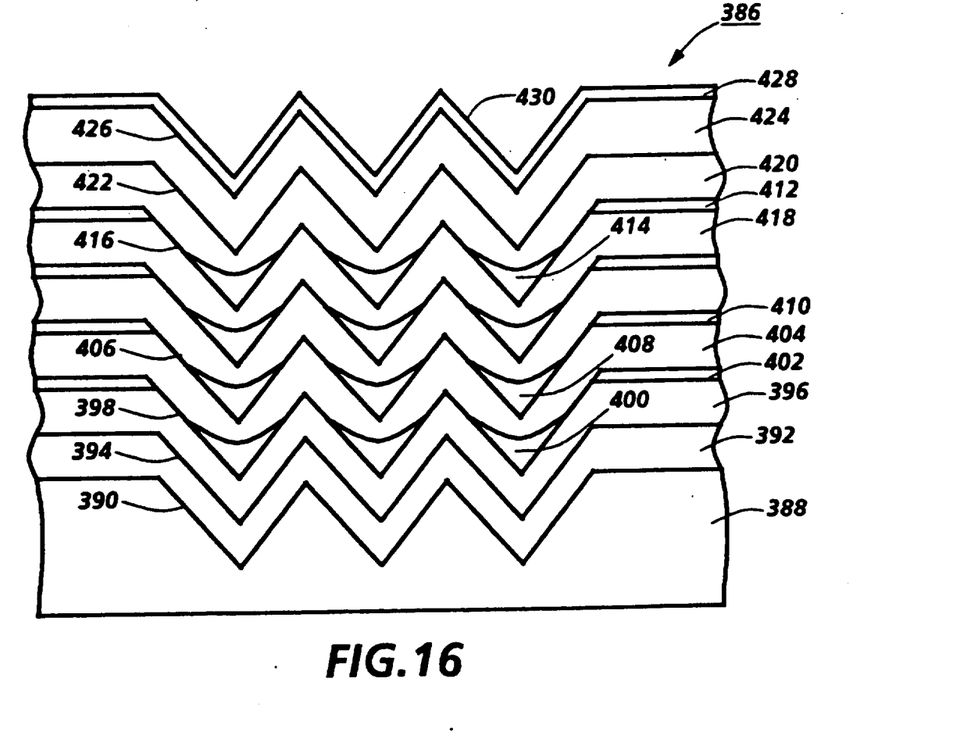
FIG. 16 is a schematic illustration of a side elevation of a two-dimensional array multiple quantum wire semiconductor laser formed according to this invention.

A two-dimensional array multiple quantum wire semiconductor laser structure 386, as shown in FIG. 16, is formed by sequentially growing more than one quantum wire on each of the series of multiple grooves fabricated in the substrate. Multiple quantum wire semiconductor laser structure 386 includes a substrate 388 of n-GaAs upon which is fabricated a series of grooves 390. By means taught previously in this application and shown in FIGS. 12 and 15, upon the substrate and grooves is epitaxially deposited a first outer cladding layer 392 of n-$Al_xGa_{1-x}As$ forming grooves 394; a first inner confinement layer 396 of n-$Al_yGa_{1-y}As$ where $x>y$ forming grooves 398 and active quantum wires 400 of GaAs, each crescent shaped in the grooves 398 fabricated by means previously taught in this application. A thinned quantum well layer 402 remains on the mesas of the inner confinement layer 396.

A barrier layer 404 of $Al_CGa_{1-C}As$ where $C \leq y$ is then epitaxially deposited over the exposed surfaces of the quantum well layer 402, the sidewalls of the grooves 398 of the inner confinement layer 396 and the quantum wires 400 forming grooves 406, by means taught previously in this application and shown in FIG. 15.

Another quantum well layer is grown on top of the barrier layer 404 and photo induced desorbed by means previously taught in this application leaving quantum wires 408 at the vertexes of the grooves 398 and a thinned quantum well layer 410 on the mesas of the barrier layer 404.

The barrier layers and horizontal series of quantum wires can be repeated as many times as desired in vertical layers. Upon the final thin quantum well layer 412, series of quantum wires 414 in grooves 416 and barrier layer 418 is epitaxially deposited a second inner confinement layer 420 of p-$Al_yGa_{1-y}As$ forming grooves 422 and second outer cladding layer 424 of p-$Al_AGa_{1-A}As$ where $x \geq$ or $\leq A \geq y$ forming grooves 426 and cap layer 428 of p+ −GaAs forming grooves 3430. Two dimensional arrays of active quantum wires provide increased modal gain for the laser cavity as compared to active regions containing a single quantum wire or a one-dimensional array of quantum wires, either horizontally or vertically.

The processing techniques in U.S. Pat. No. 4,962,057 permit the full in situ processing of a quantum wire without removal of the semiconductor structure from the MOCVD reactor or movement or masking of the structure in the reactor.

As taught previously in this application and shown in FIG. 5, the series of multiple grooves for the horizontal and two-dimensional array multiple quantum wire semiconductor laser structures can be fabricated in the outer cladding layer, rather than the substrate. Similarly, as taught previously in this application and shown in FIGS. 13 and 14, the vertical and two-dimensional array multiple quantum wire semiconductor laser structures can be fabricated wherein the light output is perpendicular to the axis of the multiple quantum wires. Reverse bias junctions and optical waveguides can be fabricated with the various embodiments of the quantum wire semiconductor laser structures.

Although the foregoing discussion has been described in connection with semiconductors of GaAs and GaAlAs, other III-V alloys may be employed in the practice of this invention, such as InGaP, InGaAsP, GaAlAsP, InGaAlP, InGaAlAsP, InP or GaAlSb or II-VI materials, e.g., ZnSe, ZnSSe and CdS. Also, Group IV materials, most importantly Si and Ge, may be utilized as semiconductor layers or a multiple quantum well structure of alternating well layers of GaAs or $Al_zGa_{1-z}As$ and corresponding barrier layers of either AlAs or $Al_{z'}Ga_{1-z'}As$ where $x>y>z'>z$. In a multiple quantum wire semiconductor structure, different quantum wires can be of different quantum well semiconductor material depending upon circumstances and needs.

The active layer may, in the alternative, be nondoped or p-type doped or n-type doped; GaAs, $Al_yGa_{1-y}As$ or $(Al_xGa_{1-x})_{0.5}In_{0.5}P$; or a relatively thin conventional double heterostructure (DH) active layer; or a single quantum well, such as GaAs or $Al_yGa_{1-y}As$ where $y<x$; or a multiple quantum well superlattice, such as alternating layers of GaAs and $Al_yGa_{1-y}As$ where $y<x$ or alternating layers of $Al_wGa_{1-w}As$ and $Al_BGa_{1-B}As$ where $B<w<x$ with a second cladding layer of p-$Al_zGa_{1-z}As$ where $B<w<z$; or a separate single or multiple quantum well structure in a separate confinement cavity.

There are alternate conventional techniques and diffusion/implant species for carrying out the desired disordering or the elemental implant/annealing technique. Discussion was confined to impurity induced disordering. However, it should be noted that these other techniques and elemental diffusions or implants are equally applicable.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. In a quantum wire semiconductor laser structure comprising:

a plurality of first semiconductor layers deposited on a substrate, said semiconductor layers and said substrate having the same conductivity type, at least one of said first semiconductor layers or said substrate having at least one groove, at least one active quantum wire formed in the vertex of at least one of said at least one groove in said immediately adjacent semiconductor layer of said first semiconductor layers, said at least one active quantum wire providing lightwave generation and propagation under lasing conditions, a plurality of second semiconductor layers deposited on said at least one active quantum wire in said at least one groove in said immediately adjacent semiconductor layer of said first semiconductor layers, said plurality of second semiconductor layers having an opposing conductivity type to said first semiconductor layers and said substrate, and one of said second semiconductor layers and one of said first semiconductor layers forming a p-n junction, such that forward-biasing said p-n junction causes said at least one quantum wire to emit light.

2. In the quantum wire semiconductor laser structure of claim 1 wherein said at least one groove is V-shaped.

3. In the quantum wire semiconductor laser structure of claim 1 wherein said at least one groove is formed in said substrate, thereby said subsequent deposited first semiconductor layers forming grooves.

4. In the quantum wire semiconductor laser structure of claim 1 wherein said at least one groove is formed in one of said first semiconductor layers, thereby all of said subsequent deposited first semiconductor layers forming grooves.

5. In the quantum wire semiconductor laser structure of claim 1 wherein said at least one active quantum wire is of a low bandgap semiconductor material and said immediately adjacent semiconductor layers of said first semiconductor layers and said second semiconductor layers are of a high bandgap semiconductor material.

6. In the quantum wire semiconductor laser structure of claim 1 further comprising a current confinement stripe in said second semiconductor layers.

7. In the quantum wire semiconductor laser structure of claim 1 wherein said first semiconductor layers have a n-type conductivity and said second semiconductor layers have a p-type conductivity.

8. In a quantum wire semiconductor laser structure with a buried reverse bias junction comprising:

a plurality of first semiconductor layers deposited on a substrate, said semiconductor layers and said substrate having the same conductivity type, at least one of said first semiconductor layers or said substrate having at least one groove, at least one active quantum wire formed in the vertex of at least one of said at least one groove in said immediately adjacent semiconductor layer of said first semiconductor layers, said active quantum wire providing lightwave generation and propagation under lasing conditions, a plurality of second semiconductor layers deposited on said at least one active quantum wire in said at least one groove in said immediately adjacent semiconductor layer of said first semiconductor layers, said plurality of second semiconductor layers having an opposing conductivity type to said first semiconductor layers and said substrate, one of said second semiconductor layers and one of said first semiconductor layers forming a p-n junction, such that forward-biasing said p-n junction causes said at least one quantum wire to emit light, and one of said second semiconductor layers being a quantum well layer having a doping content of opposite conductivity type relative to immediately adjacent semiconductor layers of said second semiconductor layers forming a reverse bias junction containing at least one current channel.

9. In the quantum wire semiconductor laser structure with a buried reverse bias junction of claim 8 wherein said reverse bias junction and said immediately adjacent semiconductor layers of said second semiconductor layers form an optical waveguide.

10. In the quantum wire semiconductor laser structure with a buried reverse bias junction of claim 9 wherein said optical wavequide is aligned with said at least one quantum wire.

11. In the quantum wire semiconductor laser structure with a buried reverse bias junction of claim 9 wherein said optical waveguide is an index guide.

12. In the quantum wire semiconductor laser structure with a buried reverse bias junction of claim 9 wherein said optical waveguide is an antiguiding structure.

13. In the quantum wire semiconductor laser structure with a buried reverse bias junction of claim 8 wherein said first semiconductor layers have a n-type conductivity and said second semiconductor layers have a p-type conductivity.

14. In a quantum wire semiconductor laser structure with a buried reverse bias junction comprising:

a plurality of first semiconductor layers deposited on a substrate, said semiconductor layers and said substrate having the same conductivity type, at least one of said first semiconductor layers or said substrate having at least one groove, one of said first semiconductor layers being a quantum well layer having a doping content of opposite conductivity type relative to immediately adjacent semicomductor layers of said first semiconductor layers forming a reverse bias junction containing at least one current channel, at least one active quantum wire formed in the vertex of at least one of said at least one groove in said immediately adjacent semiconductor layer of said first semiconductor layers, said active quantum wire providing lightwave generation and propagation under lasing conditions, and a plurality of second semiconductor layers deposited on said at least one active quantum wire in said at least one groove in said immediately adjacent semiconductor layer of said first semiconductor layers, said plurality of second semiconductor layers having an opposing conductivity type to said first semiconductor layers and said substrate, and one of said second semiconductor layers and one of said first semiconductor layers forming a p-n junction, such that forward-biasing said p-n junction causes said at least one quantum wire to emit light.

15. In the quantum wire semiconductor laser structure with a buried reverse bias junction of claim 14 wherein said reverse bias junction and said immediately adjacent semiconductor layers of said second semiconductor layers form an optical waveguide.

16. In the quantum wire semiconductor laser structure with a buried reverse bias junction of claim 15 wherein said optical waveguide is aligned with said at least one quantum wire.

17. In the quantum wire semiconductor laser structure with a buried reverse bias junction of claim 15 wherein said optical waveguide is an index guide.

18. In the quantum wire semiconductor laser structure with a buried reverse bias junction of claim 15 wherein said optical waveguide is an antiguiding structure.

19. In the quantum wire semiconductor laser structure with a buried reverse bias junction of claim 14 wherein said first semiconductor layers have a n-type conductivity and said second semiconductor layers have a p-type conductivity.

20. In a quantum wire semiconductor laser structure with a buried reverse bias junction comprising:

a plurality of first semiconductor layers deposited on a substrate, said semiconductor layers and said substrate having the same conductivity type, at least one of said first semiconductor layers or said substrate having at least one groove, one of said first semiconductor layers being a quantum well layer having a doping content of opposite conductivity type relative to immediately adjacent semiconductor layers of said first semiconductor layers forming a first reverse bias junction containing at least one current channel, at least one active quantum wire formed in the vertex of at least one of said at least one groove in said immediately adjacent semiconductor layer of said first semiconductor layers, said active quantum wire providing lightwave generation and propagation under lasing conditions, a plurality of second semiconductor layers deposited on said at least one active quantum wire in said at least one groove in said immediately adjacent semiconductor layer of said first semiconductor layers, said plurality of second semiconductor layers having an opposing conductivity type to said first semiconductor layers and said substrate, one of said second semiconductor layers and one of said first semiconductor layers forming a p-n junction, such that forward-baising saidp-n junction causes said at least one quantum wire to emit light, and one of said second semiconductor layers being a quantum well layer having a doping content of opposite conductivity type relative to immediately adjacent semiconductor layers of said second semiconductor layers forming a second reverse bias junction containing at least one current channel.

21. In the quantum wire semiconductor laser structure with a buried reverse bias junction of claim 20 wherein said first or said second reverse bias junction and said immediately adjacent semiconductor layers form an optical waveguide.

22. In the quantum wire semiconductor laser structure with a buried reverse bias junction of claim 21 wherein said optical waveguide is aligned with said at least one quantum wire.

23. In the quantum wire semiconductor laser structure with a buried reverse bias junction of claim 21 wherein said optical waveguide is an index guide.

24. In the quantum wire semiconductor laser structure with a buried reverse bias junction of claim 21 wherein said optical waveguide is antiguiding structure.

25. In the quantum wire semiconductor laser structure with a buried reverse bias junction of claim 20 wherein said first semiconductor layers have a n-type conductivity and said second semiconductor layers have a p-type conductivity.

26. In a quantum wire semiconductor laser structure with an optical waveguide comprising:

a plurality of first semiconductor layers deposited on a substrate, said semiconductor layers and said substrate having the same conductivity type, at least one of said first semiconductor layers or said substrate having at least one groove, at least one active quantum wire formed in the vertex of at least one of said at least one groove in said immediately adjacent semiconductor layer of said first semiconductor layers, said active quantum wire providing lightwave generation and propagation under lasing conditions, a plurality of second semiconductor layers deposited on said at least one active quantum wire in said at least one groove in said immediately adjacent semiconductor layer of said first semiconductor layers, said plurality of second semiconductor layers having an opposing conductivity type to said first semiconductor layers and said substrate, one of said second semiconductor layers and one of said first semiconductor layers forming a p-n junction, such that forward-biasing said p-n junction causes said at least one quantum wire to emit light, and at least two disordered regions of opposing conductivity type to said second semiconductor layers extending at least partially through said second semiconductor layers and at least partially into said first semiconductor layers forming an optical waveguide between said disordered regions.

27. In the quantum wire semiconductor laser structure with an optical waveguide of claim 26 wherein said optical waveguide is aligned with said at least one quantum wire.

28. In the quantum wire semiconductor laser structure with an optical waveguide of claim 26 wherein said first semiconductor layers have a n-type conductivity and said second semiconductor layers have a p-type conductivity.

29. In a multiple quantum wire semiconductor laser structure comprising:

a plurality of first semiconductor layers deposited on a substrate, said semiconductor layers and said substrate having the same conductivity type, at least one of said first semiconductor layers or said substrate having at least one groove, at least one active quantum wire formed in the vertex of at least one of said at least one groove in said immediately adjacent semiconductor layer of said first semiconductor layers, said active quantum wire providing lightwave generation and propagation under lasing conditions, at least one semiconductor barrier layer deposited on said at least one active quantum wire in said at least one groove in said immediately adjacent semiconductor layer of said first semiconductor layers, at least one active quantum wire formed in the vertex of said immediately adjacent semiconductor layer of said at least one semiconductor barrier layer, and a plurality of second semiconductor layers deposited on said at least one active quantum wire in said at least one groove in said immediately adjacent semiconductor barrier layer of said at least one semiconductor barrier layer, said plurality of second semiconductor layers having an opposing conductivity type to said first semiconductor layers and said substrate, and one of said second semiconductor layers and one of said first semiconductor layers form a p-n junction, such that forward-biasing said p-n junction causes said at least one quantum wire to emit light.

30. In the multiple quantum wire semiconductor laser structure of claim 29 wherein said at least one groove is V-shaped.

31. In the multiple quantum wire semiconductor laser structure of claim 29 wherein said at least one active quantum wire is of a low bandgap semiconductor material and said immediately adjacent semiconductor layers are of a high bandgap semiconductor material.

32. In the multiple quantum wire semiconductor laser struture of claim 29 further comprising a current confinement stripe in said second semiconductor layers.

33. In the multiple quantum wire semiconductor laser structure of claim 29 wherein said first semiconductor layers have a n-type conductivity and said second semiconductor layers have a p-type conductivity.

34. In the multiple quantum wire semiconductor laser structure of claim 29 wherein said at least one groove in said first semiconductor layer or said substrate is aligned with said at least one grooves in said at least one barrier layer.

35. In a quantum wire semiconductor laser structure comprising:
- a plurality of first semiconductor layers deposited on a substrate, said first semiconductor layers and said substrate having the same conductivity type, at least one of said first semiconductor layers or said substrate having at least one groove,
- at least one active quantum wire formed in the vertex of at least one of said at least one groove in said immediately adjacent semiconductor layer of said first semiconductor layers, said active quantum wire providing lightwave generation and propagation under lasing conditions,
- a pluality of second semiconductor layers deposited on said at least one active quantum wire in said at least one groove in said immediately adjacent semiconductor layer of said first semiconductor layers, said plurality of second semiconductor layers having an opposing conductivity type to said first semiconductor layers and said substrate,
- one of said second semiconductor layers and one of said first semiconductor layers forming a p-n junction, such that forward-biasing said p-n junction causes said at least one quantum wire to emit light, and
- at least two disordered regions of opposing conductivity type to said second semiconductor layers extending through said second semiconductor layers and partially into said first semiconductor layers bounding said at least one quantum wire forming an optical cavity between said disordered regions such that said lightwave generation and propagation under lasing conditions is perpendicular to said at least one quantum wire.

36. In the quantum wire semiconductor laser structure of claims 35 wherein said at least one active quantum wire is of a low bandgap semiconductor material and said immediately adjacent semiconductor layers are of a high bandgap semiconductor material.

37. In the quantum wire semiconductor laser structure of claim 35 further comprising a current confinement stripe in said second semiconductor layers.

38. In the quantum wire semiconductor laser structure of claim 35 wherein said first semiconductor layers have a n-type conductivity and said second semiconductor layers have a p-type conductivity.

* * * * *